US008836143B2

(12) United States Patent
Luan

(10) Patent No.: US 8,836,143 B2
(45) Date of Patent: Sep. 16, 2014

(54) CHIP PACKAGE WITH COPLANARITY CONTROLLING FEATURE

(75) Inventor: Jing-en Luan, Shenzhen (CN)

(73) Assignee: STMicroelectronics Asia Pacific Pte Ltd., Singapore (SG)

(*) Notice: Subject to any disclaimer, the term of this patent is extended or adjusted under 35 U.S.C. 154(b) by 6 days.

(21) Appl. No.: 13/605,841

(22) Filed: Sep. 6, 2012

(65) Prior Publication Data

US 2013/0009326 A1    Jan. 10, 2013

Related U.S. Application Data

(62) Division of application No. 12/330,143, filed on Dec. 8, 2008, now Pat. No. 8,278,146.

(51) Int. Cl.
*H01L 23/31* (2006.01)
*H01L 25/00* (2006.01)
*H01L 25/10* (2006.01)
*H01L 25/18* (2006.01)
*H01L 23/00* (2006.01)

(52) U.S. Cl.
CPC ... *H01L 23/3128* (2013.01); *H01L 2924/01029* (2013.01); *H01L 2224/48227* (2013.01); *H01L 2224/73265* (2013.01); *H01L 2924/15331* (2013.01); *H01L 2924/078* (2013.01); *H01L 2924/15153* (2013.01); *H01L 2924/1517* (2013.01); *H01L 2924/15311* (2013.01); *H01L 25/50* (2013.01); *H01L 2224/48465* (2013.01); *H01L 2224/32225* (2013.01); *H01L 24/28* (2013.01); *H01L 2225/1023* (2013.01); *H01L 2924/01079* (2013.01); *H01L 2924/01087* (2013.01); *H01L 2224/32145* (2013.01); *H01L 2924/1433* (2013.01); *H01L 2924/3511* (2013.01); *H01L 25/105* (2013.01); *H01L 2225/1058* (2013.01); *H01L 2224/48091* (2013.01); *H01L 24/48* (2013.01); *H01L 25/18* (2013.01); *H01L 2924/14* (2013.01)
USPC ............................................... 257/777

(58) Field of Classification Search
CPC . H01L 23/488; H01L 23/3128; H01L 25/105; H01L 25/18; H01L 25/50
USPC .......................................... 257/777, E23.023
See application file for complete search history.

(56) References Cited

U.S. PATENT DOCUMENTS

| | | | |
|---|---|---|---|
| 5,708,300 A | 1/1998 | Woosley et al. | |
| 5,886,398 A | 3/1999 | Low et al. | |
| 6,177,724 B1 | 1/2001 | Sawai | |
| 7,338,838 B2 | 3/2008 | Minamio et al. | |
| 2002/0048845 A1 | 4/2002 | Barrett | |
| 2010/0140809 A1* | 6/2010 | Chow et al. | 257/777 |

OTHER PUBLICATIONS

Jing-en Luan, "Design for Improvement of Drop Impact Performance of Package-on Package," Electronics Packaging Technology Conference, 2007. EPTC 2007. 9th , vol., No., pp. 937,942, Dec. 10-12, 2007.*

* cited by examiner

*Primary Examiner* — Walter H Swanson
(74) *Attorney, Agent, or Firm* — Seed IP Law Group PLLC

(57) ABSTRACT

A chip package includes a substrate, an integrated circuit proximate a top surface of the substrate, and a cap comprising encapsulant that encapsulates the integrated circuit on at least a portion of the top surface of the substrate. The chip package further includes at least one extension feature positioned on at least a portion of the top surface of the substrate. The at least one extension feature also comprises the encapsulant and extends from the cap to a perimeter of the substrate.

19 Claims, 6 Drawing Sheets

CHIP PACKAGE WITH COPLANARITY CONTROLLING FEATURE

CROSS-REFERENCE TO RELATED APPLICATION

This application is a divisional of U.S. patent application Ser. No. 12/330,143 filed Dec. 8, 2008, which application is incorporated herein by reference in its entirety.

BACKGROUND

1. Technical Field

This description generally relates to the field of integrated circuits, and more particularly to chip packaging for integrated circuits.

2. Description of the Related Art

In many compact electronic devices, there is less and less room to accommodate bulky chip packages. As a result, a number of manufacturers have begun stacking chip packages on top of one another to form "package-on-package" solutions. Such chip packages may comprise, for example, a top chip package holding a memory subsystem stacked on top of a bottom chip package carrying logic circuitry. The memory and logic package-on-package may take up little more room than the logic chip package alone.

In FIG. 1, a schematic view of one exemplary bottom chip package 1 that might be incorporated into a package-on-package is illustrated. FIG. 2 illustrates a schematic, cross-sectional view of the bottom chip package 1 alone, and FIG. 3 illustrates a cross-sectional view of the bottom chip package 1 coupled to a top chip package 2 in a package-on-package 3. As illustrated in FIGS. 1 and 2, a conventional bottom chip package 1 may include a substrate 10 on which an integrated circuit 12 is mounted. The integrated circuit 12 may then be encapsulated by an encapsulant to form a cap 14, leaving bond pads 16 exposed around the perimeter of the bottom chip package 1 to form electrical connections with the top chip package 2.

Unfortunately, in many package-on-package products, the bottom chip package may suffer from poor coplanarity. That is, with reference to FIG. 2, the left and right edges of the substrate 10 may curve up or down in what is known as smiling or crying warpage, respectively. Such coplanarity may worsen as the bottom chip package 1 undergoes thermal processing during manufacture of the package-on-package 3. This poor coplanarity of the bottom chip package 1 may result in high yield loss and bad solder joint quality and reliability between the bottom chip package 1 and the top chip package 2. There is therefore a need in the art for a chip package with improved coplanarity.

BRIEF SUMMARY

A method of manufacturing a chip package may be summarized as comprising: placing an integrated circuit proximate a top surface of a substrate, the substrate having a plurality of top bond pads and a plurality of bottom bond pads; forming electrical connections between the integrated circuit and a first subset of the plurality of top bond pads; encapsulating the integrated circuit in an encapsulant to form a cap on at least a portion of the top surface of the substrate, the substrate having a second subset of the plurality of top bond pads positioned outside of a perimeter of the cap; and forming at least one extension feature from the encapsulant on at least a portion of the top surface of the substrate, the at least one extension feature extending from the cap to a perimeter of the substrate, and the substrate having at least two bond pads of the second subset not covered by the at least one extension feature.

A chip package may be summarized as comprising: a substrate having a plurality of top bond pads and a plurality of bottom bond pads; an integrated circuit proximate a top surface of the substrate, the integrated circuit having terminals electrically coupled to a first subset of the plurality of top bond pads; a cap encapsulating the integrated circuit on at least a portion of the top surface of the substrate, the substrate having a second subset of the plurality of top bond pads positioned outside of a perimeter of the cap, and the cap comprising an encapsulant; and at least one extension feature comprising the encapsulant positioned on at least a portion of the top surface of the substrate, the at least one extension feature extending from the cap to a perimeter of the substrate, and the substrate having at least two bond pads of the second subset not covered by the at least one extension feature.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles may not be drawn to scale, and some of these elements may have been enlarged and positioned to improve drawing legibility.

DETAILED DESCRIPTION OF EMBODIMENTS OF THE INVENTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures and methods associated with integrated circuits and semiconductor manufacturing/packaging processes have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the embodiments.

Description of an Exemplary Chip Package

Figure 1:
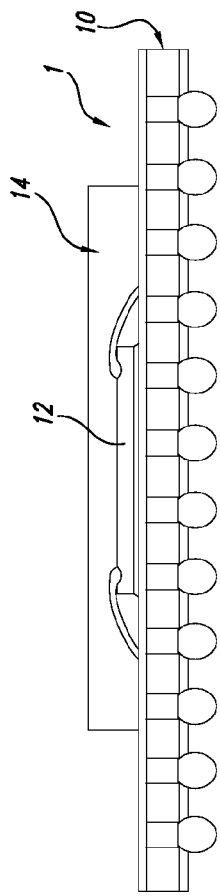
FIG. 1 is a top, schematic view of a bottom chip package, according to the prior art.
Figure 2:
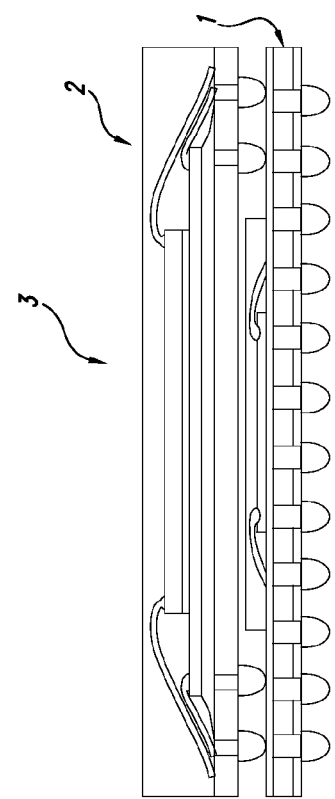
FIG. 2 is a cross-sectional, schematic view of the bottom chip package of FIG. 1.
Figure 3:
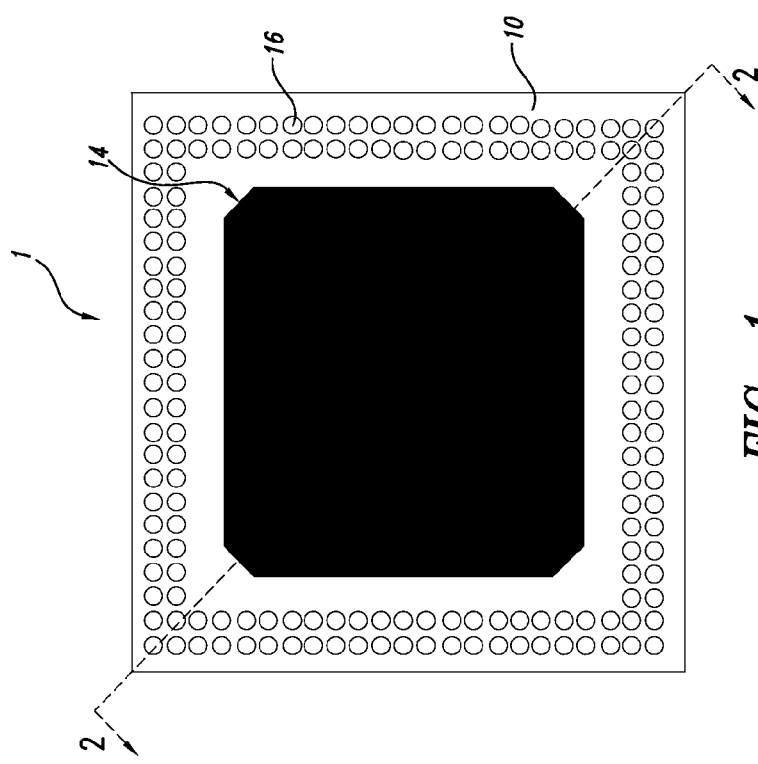
FIG. 3 is a cross-sectional, schematic view of the bottom chip package of FIG. 1 coupled to a top chip package, forming a package-on-package, according to the prior art.
Figure 4:
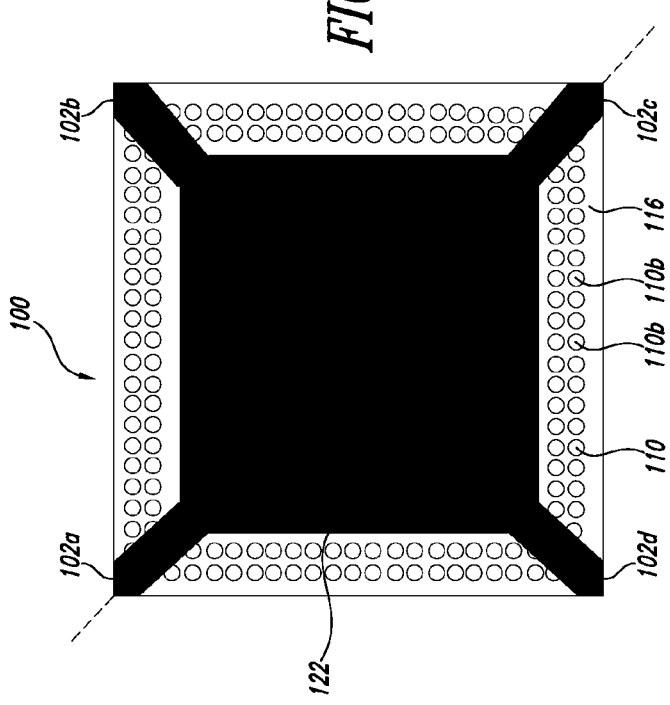
FIG. 4 is a top, schematic view of a chip package incorporating at least one extension feature, according to one embodiment.
Figure 5:
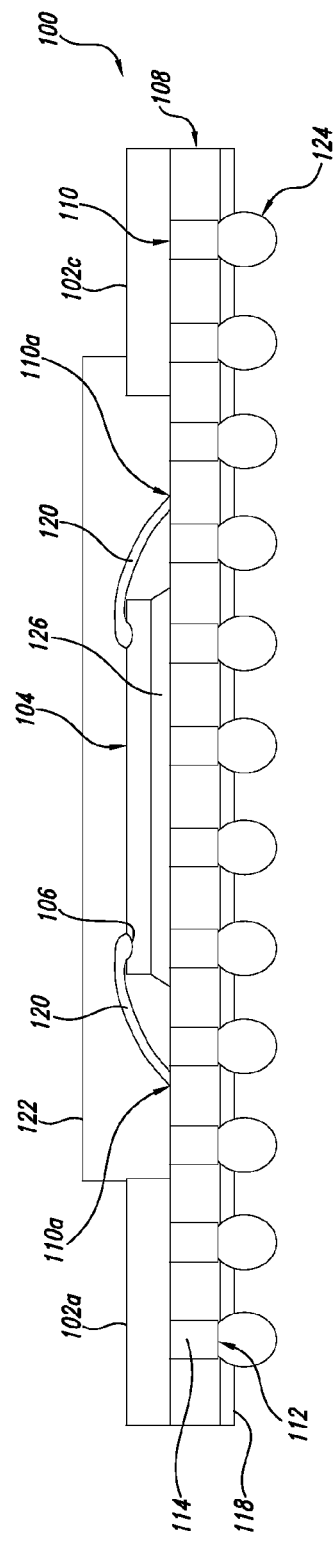
FIG. 5 is a cross-sectional, schematic view of the chip package of FIG. 4, according to one embodiment.

FIG. 4 shows a top view and FIG. 5 shows a cross-sectional view of one exemplary chip package 100 incorporating extension features 102a-d (collectively 102), according to one illustrated embodiment. The chip package 100 may be configured to protect an integrated circuit 104 from the external environment. In some embodiments, the chip package 100 may even include more than one integrated circuit 104. The chip package 100 may comprise a bottom chip package designed for incorporation into a package-on-package. In another embodiment, the term "chip package" may be understood to include a package-on-package. In other embodiments, the chip package 100 may not ultimately be incorporated into a package-on-package.

The integrated circuit 104 may include any of a variety of electronic circuitry. For example, the integrated circuit 104 may include logic circuitry and may function as a controller for an electronic computing device. In another embodiment, the integrated circuit 104 may comprise computer-readable memory. In different embodiments, the integrated circuit 104 may be formed using any of a variety of semiconductor fabrication processes. In one embodiment, the integrated circuit 104 is defined by layers of semi-conducting, dielectric and conducting materials deposited onto a semiconductor substrate in accordance with pre-defined patterns.

The integrated circuit 104 may include a plurality of terminals 106 configured to provide electrical connections to the integrated circuit 104. As illustrated, the terminals 106 may be positioned on a top surface of the integrated circuit 104. Of course, the terms, top and bottom, refer only to the orientation of the surfaces in FIG. 5, and should not be understood to imply any absolute positioning of the integrated circuit 104. In other embodiments, the terminals 106 may be positioned proximate other surfaces on the integrated circuit 104. The terminals 106 may be configured to provide electricity to circuitry of the integrated circuit 104 as well as to transmit input/output signals to and from the integrated circuit 104. In different embodiments, the integrated circuit 104 may include more or fewer terminals 106. For example, controller circuitry may require more terminals 106 defining input/outputs than memory circuitry. The terminals 106 may comprise any type of conducting material, such as copper, silver or gold.

The integrated circuit 104 may have any of a variety of shapes and sizes. In one embodiment, the integrated circuit 104 has a generally rectilinear shape when viewed from the top. In other embodiments, more irregular shapes may define the integrated circuit 104.

The chip package 100 may further comprise a substrate 108 having a plurality of top bond pads 110 and a plurality of bottom bond pads 112. The substrate 108 may comprise any of a variety of dielectric materials configured to support the integrated circuit 104. In one embodiment, the substrate 108 comprises one or more layers of dielectric material, forming a laminate substrate. For example, the substrate 108 may comprise FR-4 material (similar to that used to fabricate printed circuit boards). The top and bottom bond pads 110, 112 may comprise any type of conducting material, such as copper, silver or gold.

The substrate 108 may further include electrical vias 114 formed therethrough. These electrical vias 114 may be configured to electrically couple a top surface 116 of the substrate 108 to a bottom surface 118 of the substrate 108. In one embodiment, as illustrated in FIG. 5, the electrical vias 114 may interconnect some of the top bond pads 110 to corresponding bottom bond pads 112.

The substrate 108, like the integrated circuit 104, may have any of a variety of shapes and sizes. As illustrated, the substrate 108 is larger than the integrated circuit 104. The substrate 108 may further have a generally rectilinear shape, such that the shape of the substrate 108 and the shape of the integrated circuit 104 are geometrically similar.

In different embodiments, the substrate 108 may incorporate more or fewer top bond pads 110, and these top bond pads 110 may be positioned at different locations across the top surface 116 of the substrate 108. In one embodiment, the top bond pads 110 of the substrate 108 are divided into a number of subsets. As most easily seen in FIG. 5, a first subset of the plurality of top bond pads 110a (also referred to as an IC subset below) may be electrically coupled to the terminals 106 of the integrated circuit 104. In one embodiment, for example, wires 120 may extend from the terminals 106 of the integrated circuit 104 to the IC subset 110a. In other embodiments, other structures for forming an electrical connection between these terminals 106 and the IC subset of the top bond pads 110a may be used. As most easily seen in FIG. 4, a second subset of the top bond pads 110b (also referred to as a top package subset below) may be positioned outside of a perimeter of a cap 122 encapsulating the integrated circuit 104. In one embodiment, this top package subset 110b may be configured to form at least one electrical connection with a top chip package mounted atop the chip package 100.

The substrate 108 may also incorporate more or fewer bottom bond pads 112, and these bottom bond pads 112 may be positioned at different locations across the bottom surface 118 of the substrate 108. In one embodiment, the bottom bond pads 112 of the substrate 108 are configured to form at least one electrical connection with external circuitry, such as a printed circuit board. In one embodiment, as illustrated in FIG. 5, a plurality of bumps 124 may be coupled to a corresponding plurality of the bottom bond pads 112 in order to facilitate the mounting of the chip package 100. In other embodiments, the bottom bond pads 112 may include alternative structures configured to enable the formation of electrical connections with external circuitry. The bottom bond pads 112 may be electrically coupled to a variety of other components in the chip package 100. For example, the bottom bond pads 112 may be electrically coupled to one or more top bond pads 110 through the electrical vias 114. These electrical vias 114 may electrically couple a bottom bond pad 112 to the integrated circuit 104 through one of the IC subset of the top bond pads 110a, or may electrically couple a bottom bond pad 112 to a top chip package through one of the top package subset of the top bond pads 110b.

As illustrated, the integrated circuit 104 may be positioned proximate the top surface 116 of the substrate 108. In one embodiment, the chip package 100 includes an adhesive layer 126 positioned between the integrated circuit 104 and the top surface 116 of the substrate 108. The adhesive layer 126 may comprise any of a variety of adhesive materials configured to adhere to both the integrated circuit 104 and the substrate 108. In some embodiments, the adhesive layer 126 comprises an adhesive glue, such as an epoxy. In other embodiments, the adhesive layer 126 comprises double-sided tape positioned between the substrate 108 and the integrated circuit 104. In still other embodiments, the chip package 100 may not include an adhesive layer 126, and other structures may be used to position the integrated circuit 104 proximate the top surface 116 of the substrate 108.

The chip package 100 may further comprise a cap 122 encapsulating the integrated circuit 104 on at least a portion of the top surface 116 of the substrate 108. As described above, the cap 122 may be positioned such that the top package subset of the top bond pads 110b is positioned outside of a perimeter of the cap 122 (as shown in FIG. 4). The cap 122 may have any of a variety of shapes and sizes. As illustrated, the cap 122 is configured to completely surround and encapsulate the integrated circuit 104. The cap 122 may be further configured to encapsulate the IC subset of the top bond pads 110a, as shown in FIG. 5. In one embodiment, the cap 122 has a generally rectilinear shape, such that the shape of the cap 122 and the shape of the integrated circuit 104 are geometrically similar.

In one embodiment, the cap 122 comprises an encapsulant, such as a molding compound, having a different composition than the laminate forming the substrate 108. The encapsulant may comprise any of a variety of molding compounds and may be a dielectric material that serves to electrically insulate as well as protect the integrated circuit 104 from the external environment.

In one embodiment, the chip package 100 further includes at least one extension feature 102 comprising the encapsulant. The at least one extension feature 102 and the cap 122 may thus be formed substantially simultaneously (e.g., using the same mold used to form the cap 122). The extension features 102 may be positioned on at least a portion of the top surface 116 of the substrate 108 and may extend from the cap 122 to a perimeter of the substrate 108. As illustrated, the extension features 102 may cover at least one of the top package subset of the top bond pads 110b. The extension features 102 may also be shaped and sized such that at least two bond pads of the top package subset of the top bond pads 110b are not covered by the extension features 102. Thus, a top chip package may later be electrically coupled to these at least two exposed bond pads. In one embodiment, the extension features 102 may enable improved coplanarity of the chip package 100, extending encapsulant from the cap 122 to the perimeter of the substrate 108 and thus increasing the rigidity to the chip package 100.

As illustrated, a plurality of extension features 102 may be incorporated into the chip package 100. Of course, in different embodiments, more or fewer extension features 102 may be used. Indeed, in one embodiment, only one extension feature 102 may be incorporated into the chip package 100.

The extension features 102 may have any of a variety of shapes, orientations and sizes. In one embodiment, each of a plurality of extension features 102 is positioned substantially opposite another of the plurality of extension features 102. This arrangement is illustrated in FIG. 4, in which the extension feature 102a is positioned substantially opposite the extension feature 102c, and the extension feature 102b is positioned substantially opposite the extension feature 102d. In another embodiment, four extension features 102 may generally extend along diagonals of a substantially rectilinear substrate 108. Thus, each extension feature 102 may extend from the cap 122 to a respective corner of the substrate 108. In other embodiments, the extension features 102 may be formed between different portions of the cap 122 and the perimeter of the substrate 108. As illustrated in FIG. 5, a height of the extension features 102 may be less than a height of the cap 122. However, in other embodiments, the height of the extension features 102 may be substantially equal to or even greater than the height of the cap 122.

Description of an Exemplary Package-on-Package

Figure 6A:
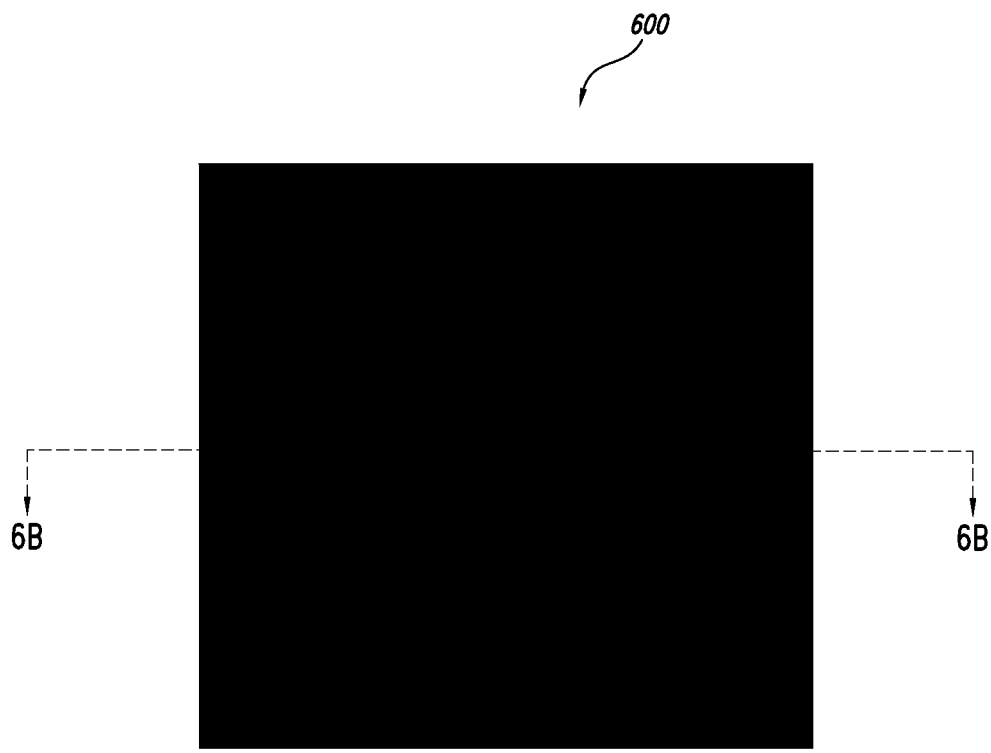
FIG. 6A is a top view of a package-on-package incorporating the chip package of FIG. 4 as a bottom chip package, according to one embodiment.
Figure 6B:
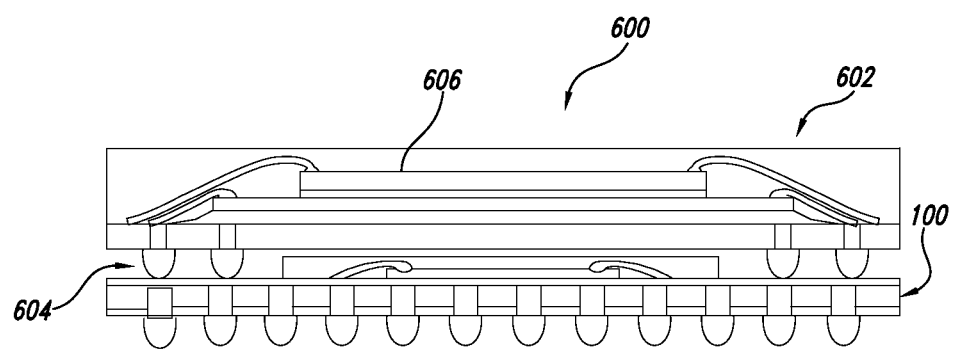
FIG. 6B is a cross-sectional, schematic view of the package-on-package of FIG. 6A, according to one embodiment.

FIGS. 6A and 6B illustrate a top view and a cross-sectional, side view, respectively, of a package-on-package 600 incorporating the chip package 100 of FIGS. 4 and 5 as a bottom chip package. In one embodiment, as illustrated, a top chip package 602 may be electrically coupled to at least two exposed bond pads of the top package subset of top bond pads 110b. For example, bumps 604 may couple the top chip package 602 and the chip package 100.

The electrical connections between the top chip package 602 and the chip package 100 may enable an integrated circuit 606 within the top chip package 602 to exchange information with the integrated circuit 104 encapsulated by the chip package 100. In one embodiment, the electrical connections may further provide electricity, as well as input/output connectivity, to the top chip package 602 through the substrate 108 to external circuitry coupled to the substrate 108 (e.g., through the electrical vias 114).

Description of Additional Chip Package Embodiments

Figure 7:
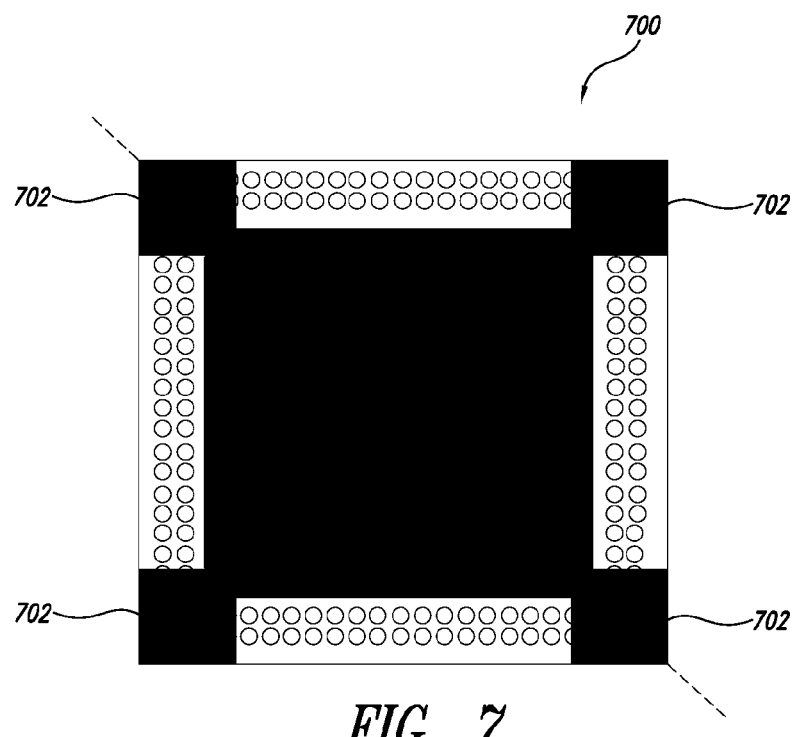
FIG. 7 is a top, schematic view of another chip package incorporating at least one extension feature, according to one embodiment.
Figure 8:
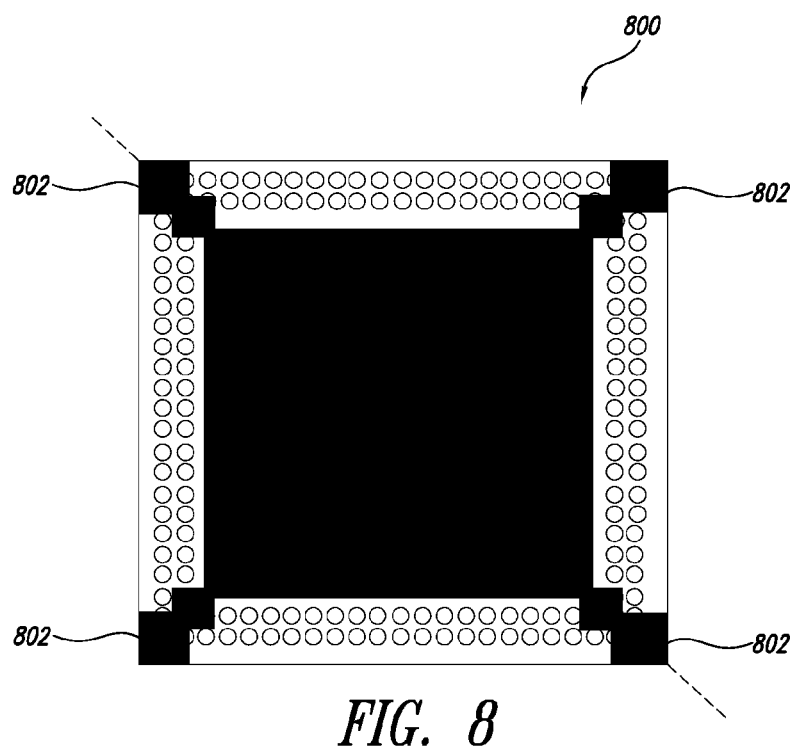
FIG. 8 is a top, schematic view of yet another chip package incorporating at least one extension feature, according to one embodiment.
Figure 9:
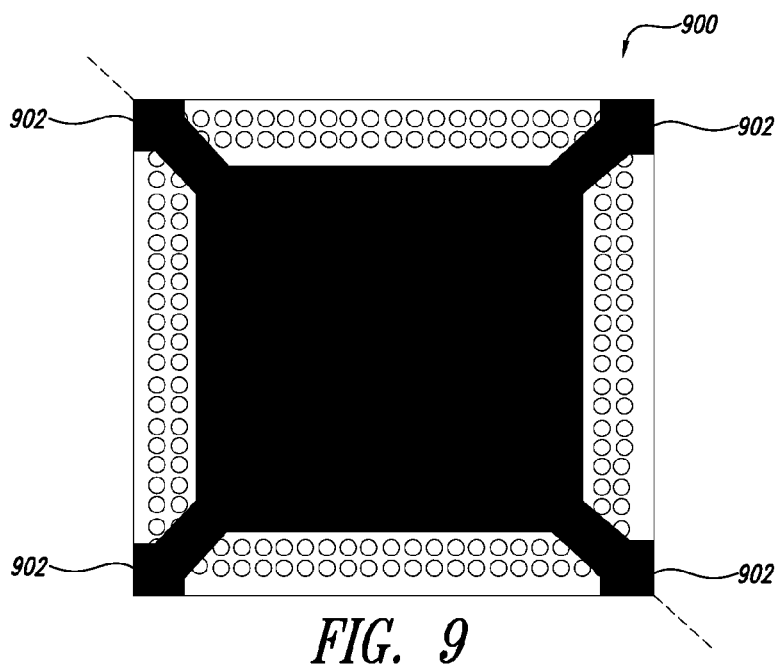
FIG. 9 is a top, schematic view of yet another chip package incorporating at least one extension feature, according to one embodiment.

FIGS. 7-11 illustrate some additional configurations for extension features that may be incorporated into chip packages. FIGS. 7 through 9 show a plurality of respective chip packages 700, 800, 900, incorporating differently shaped extension features 702, 802, 902. These and other extension features having other shapes may be used to provide improved coplanarity for their respective chip packages.

Figure 10:
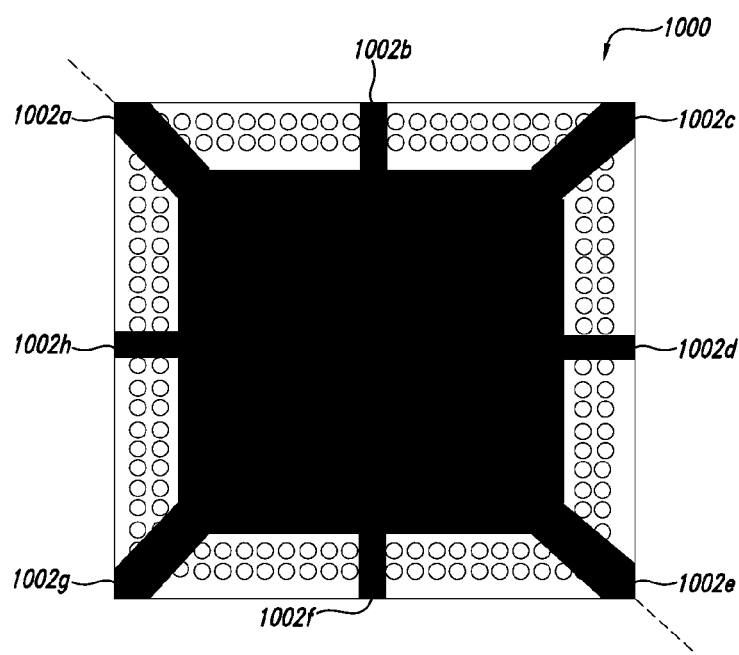
FIG. 10 is a top, schematic view of still another chip package incorporating at least one extension feature, according to one embodiment.

FIG. 10 illustrates a chip package 1000 incorporating eight extension features 1002a-h (collectively 1002). As illustrated in FIG. 10, the extension features 1002 need not be formed solely along the diagonals of the chip package 1000, but may also be formed at other locations about the perimeter of the chip package 1000.

Figure 11:
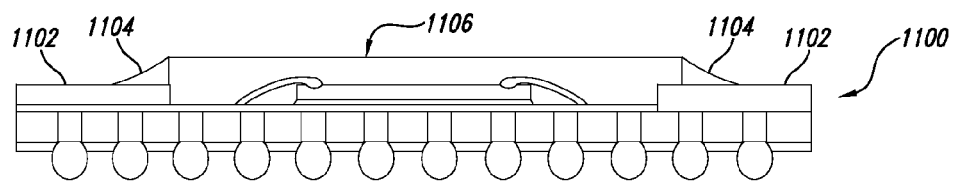
FIG. 11 is a cross-sectional, schematic view of another chip package incorporating at least one extension feature, according to one embodiment.

FIG. 11 illustrates another example chip package 1100 incorporating extension features 1102. In one embodiment, the extension features 1102 may include a transition section 1104. The transition section 1104 may define a transition in height from a height of the cap 1106 to a lower height of the extension feature 1102. Of course, other variations in height along the extension features may also occur in different implementations.

As described above, the extension features may form any of a variety of shapes and sizes.

Description of an Exemplary Method for Manufacturing a Chip Package

Figure 12:
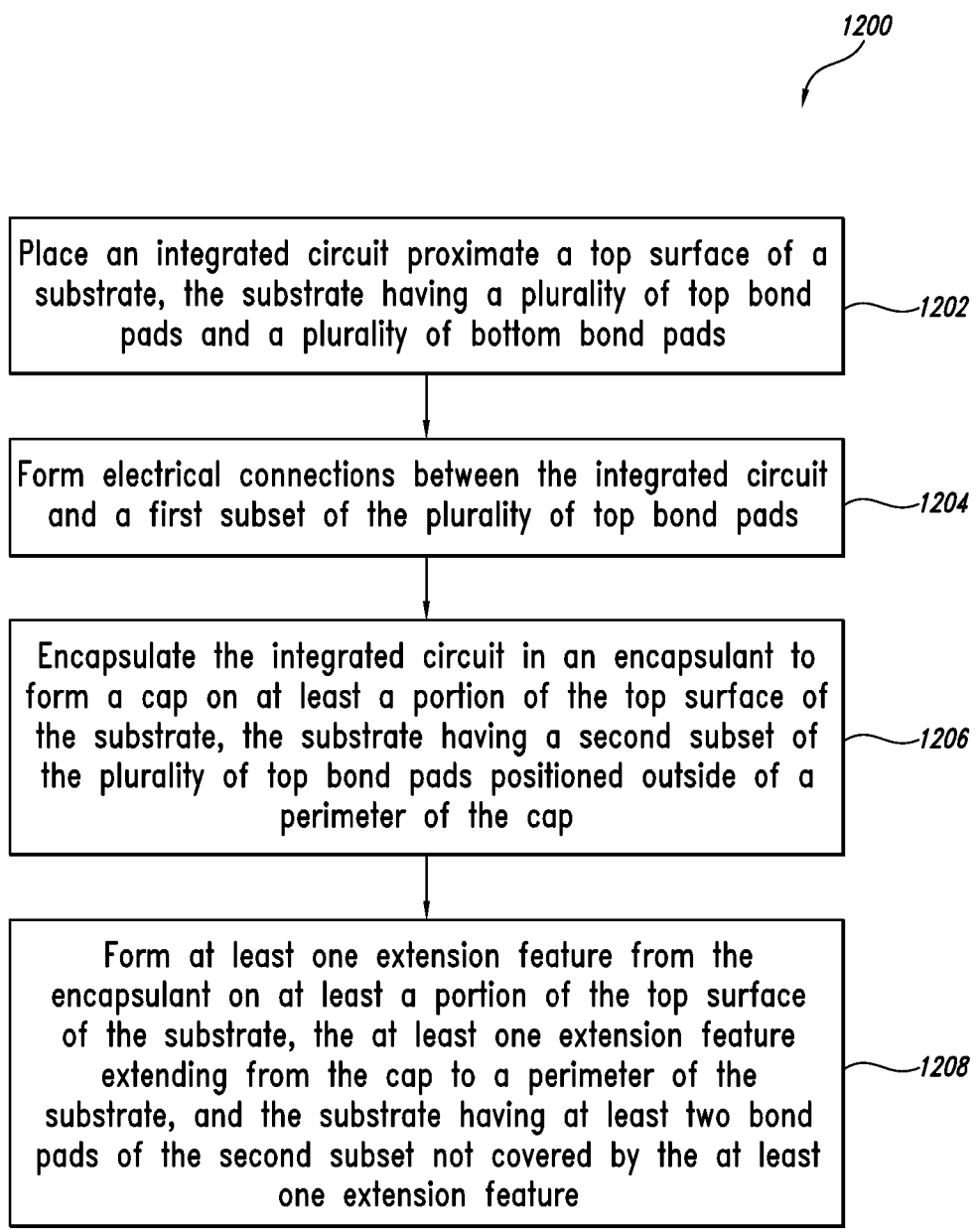
FIG. 12 is a flow diagram illustrating one method of manufacturing a chip package, according to one embodiment.

FIG. 12 illustrates a flow diagram for a method 1200 of manufacturing a chip package, according to one embodiment. This method 1200 will be discussed in the context of the chip package 100. However, it may be understood that the acts disclosed herein may also be executed to manufacture any of a variety of chip packages, including the chip packages 700, 800, 900, 1000, 1100 described above, in accordance with the described method.

As described herein, all of the acts comprising the method 1200 may be orchestrated by a manufacturing processor or controller based at least in part on execution of computer-readable instructions stored in a computer-readable memory. In other embodiments, a hardware implementation of all or some of the acts of method 1200 may be used.

The method begins at 1202, when an integrated circuit 104 is placed proximate a top surface 116 of a substrate 108, the substrate 108 having a plurality of top bond pads 110 and a plurality of bottom bond pads 112. The integrated circuit 104 may be formed by any of a variety of manufacturing processes. In one embodiment, a semiconductor wafer may be processed to form a plurality of integrated circuits 104. The wafer may then be divided (e.g., laser-cut or die sawed) to define the individual integrated circuits 104.

The substrate 108 may also be formed in a variety of ways. In one embodiment, a laminate wafer of substrate material is first processed to define a plurality of top bond pads and bottom bond pads, as well as electrical vias therethrough. The laminate wafer may then be divided (e.g., laser-cut or die sawed) to form a plurality of substrates 108, and each of these substrates 108 may be used to form respective chip packages 100. In other embodiments, other manufacturing processes may be employed.

As described above, the substrate 108 may comprise any of a variety of dielectric materials, such as FR-4 material. The bond pads 110, 112, too, may comprise any of a variety of electrically conductive materials.

The integrated circuit 104 may be placed atop the substrate 108 in a variety of ways. For example, in one embodiment, a robotic end effector may be used to properly position the integrated circuit 104. In another embodiment, a human operator places the integrated circuit 104 manually or by a user-controlled machine.

In one embodiment, the integrated circuit 104 is placed adjacent the top surface 116 of the substrate 108 without intervening materials. In other embodiments, the integrated circuit 104 may be coupled to the top surface 116 of the substrate 108 via an adhesive layer 126. For example, a piece of double-sided tape may be affixed to a bottom surface of the integrated circuit 104, and the tape and integrated circuit 104 may then be affixed to the top surface 116 of the substrate 108. As another example, an adhesive glue may first be deposited on the top surface 116 of the substrate 108, and the integrated circuit 104 may be placed atop the adhesive glue.

At act 1204, electrical connections are formed between the integrated circuit 104 and a first subset of the plurality of top bond pads 110a. In different embodiments, different numbers of electrical connections may be required to meet the input/output and power requirements of the integrated circuit 104.

The electrical connections may be formed by any of a variety of electrically conductive structures extending between the integrated circuit 104 and the first subset 110a. In one embodiment, wires 120 are connected from terminals 106 on the integrated circuit 104 facing away from the substrate 108 to the first subset of the top bond pads 110a. In another embodiment, the integrated circuit 104 may include terminals on a surface facing the substrate 108, and bumps may be used to form electrical connections between the integrated circuit 104 and the substrate 108.

At act 1206, the integrated circuit 104 is encapsulated in an encapsulant to form a cap 122 on at least a portion of the top surface 116 of the substrate 108, the substrate 108 having a second subset of the plurality of top bond pads 110b positioned outside of a perimeter of the cap 122. The cap 122 may be formed by any of a variety of manufacturing processes. In one embodiment, a mold cavity is used to form the cap 122. The mold cavity may be placed against the top surface 116 of the substrate 108 over the integrated circuit 104, and an encapsulant may be injected into the mold cavity and allowed to set. Further processing steps may also be carried out. For example, the encapsulant may be heat-treated, cold-treated or otherwise processed in order to change the chemical or physical characteristics of the cap 122. In other embodiments, other manufacturing processes for forming the cap 122 may be used.

At act 1208, at least one extension feature 102 is formed from the encapsulant on at least a portion of the top surface 116 of the substrate 108, the at least one extension feature 102 extending from the cap 122 to a perimeter of the substrate 108, and the substrate 108 having at least two bond pads of the second subset 110b not covered by the at least one extension feature 102. The at least one extension feature 102 may define any of a variety of different shapes and sizes as described and illustrated in greater detail above.

In one embodiment, the at least one extension feature 102 may be formed substantially simultaneously with the encapsulation of the integrated circuit 104. For example, a common mold cavity defining both the cap 122 and the at least one extension feature 102 may be used to substantially simultaneously encapsulate the integrated circuit 104 and form the at least one extension feature 102. In other embodiments, additional mold cavities and molding steps may be used in order to form the at least one extension feature 102.

In some embodiments, as illustrated in FIGS. 6A and 6B, a package-on-package 600 may be manufactured after the chip package 100 is completed. A top chip package 602 may be manufactured in accordance with any of a number of manufacturing processes, and then placed proximate the substrate 108. Electrical connections may then be formed between the top chip package 602 and the at least two bond pads of the second subset 110b not covered by the at least one extension feature 102. For example, bumps 604 may be used to form the electrical connections between the two packages 602, 100.

The foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more programs executed by one or more processors, as one or more programs executed by one or more controllers (e.g., microcontrollers), as firmware, or as virtually any combination thereof, and that designing the circuitry and/or writing the code for the software and or firmware would be well within the skill of one of ordinary skill in the art in light of this disclosure.

When logic is implemented as software and stored in memory, one skilled in the art will appreciate that logic or information can be stored on any computer readable storage medium for use by or in connection with any processor-related system or method. In the context of this document, a memory is a computer readable storage medium that is an electronic, magnetic, optical, or other physical device or means that contains or stores a computer and/or processor program and/or data or information. Logic and/or the information can be embodied in any computer readable storage medium for use by or in connection with an instruction execution system, apparatus, or device, such as a computer-based system, processor-containing system, or other system that can fetch the instructions from the instruction execution system, apparatus, or device and execute the instructions associated with logic and/or information.

The various embodiments described above can be combined to provide further embodiments. From the foregoing it will be appreciated that, although specific embodiments have been described herein for purposes of illustration, various modifications may be made without deviating from the spirit and scope of the teachings. Accordingly, the claims are not limited by the disclosed embodiments.

I claim:

1. A package-on-package chip package, comprising:
a substrate having a plurality of top bond pads and a plurality of bottom bond pads;
an integrated circuit proximate a top surface of the substrate, the integrated circuit having terminals electrically coupled to a first subset of the plurality of top bond pads;
a cap encapsulating the integrated circuit on at least a portion of the top surface of the substrate, the substrate having a second subset of the plurality of top bond pads positioned outside of a perimeter of the cap, and the cap comprising an encapsulant;
a plurality of extension features comprising the encapsulant positioned on at least a portion of the top surface of the substrate, the plurality of extension features extending from the cap to a perimeter of the substrate, the plurality of extension features having a height measured from the top surface of the substrate to a top surface of the plurality of extension features above the substrate that is less than a height of the cap, and the substrate having at least two top bond pads of the second subset not covered by the plurality of extension features; and
a top chip package electrically coupled to the at least two top bond pads of the second subset.

2. The chip package of claim 1, wherein at least one of the plurality of extension features extends to only one side of the substrate.

3. The chip package of claim 1, wherein the substrate comprises a laminate having a different composition than the encapsulant.

4. The chip package of claim 1, further comprising an adhesive layer positioned between the integrated circuit and the top surface of the substrate.

5. The chip package of claim 1, wherein the cap further encapsulates the first subset of the plurality of top bond pads.

6. The chip package of claim 1, wherein the substrate is substantially rectilinear, and the plurality of extension features includes four extension features, each of the four extension features extending from the cap to a respective corner of the substrate.

7. The chip package of claim 1, wherein each of the plurality of extension features is positioned substantially opposite another of the plurality of extension features.

8. The chip package of claim 1, wherein at least one of the plurality of extension features covers at least one of the second subset of the plurality of top bond pads.

9. The chip package of claim 1, wherein at least one of the plurality of extension features has a transition section defining a transition in height from the height of the cap to the lower height of the at least one of the plurality of extension features.

10. A chip package, comprising:
a substrate having a plurality of bond pads on a surface;
an integrated circuit adjacent to the surface of the substrate, the integrated circuit having terminals electrically coupled to respective ones of the plurality of bond pads;
a cap on the surface of the substrate encapsulating the integrated circuit and the respective ones of the plurality of bond pads, the cap leaving a subset of the bond pads exposed on the surface of the substrate; and
a plurality of extensions extending on the surface of the substrate from the cap to a perimeter of the substrate to control warpage of the substrate, the plurality of extensions leaving the subset of the bond pads exposed on the surface of the substrate.

11. The chip package of claim 10, further comprising:
a top chip package positioned over the cap and adjacent to the surface of the substrate, and the top chip package electrically coupled to the subset of bond pads exposed on the surface of the substrate.

12. The chip package of claim 10, wherein the plurality of extensions extend diagonally from the cap to respective corners of the substrate.

13. The chip package of claim 10, wherein the plurality of extensions are composed of encapsulating material and formed integrally with the cap.

14. A chip package, comprising:
a substrate having a plurality of bond pads on a surface;
an integrated circuit adjacent to the surface of the substrate, the integrated circuit electrically coupled to a first subset of the plurality of bond pads;
a cap on the surface of the substrate encapsulating the integrated circuit and the first subset of bond pads, the cap leaving a second subset of the bond pads exposed on the surface of the substrate; and
a plurality of extensions extending on the surface of the substrate from the cap to a perimeter of the substrate, the plurality of extensions leaving the second subset of the bond pads exposed on the surface of the substrate.

15. The chip package of claim 14, further comprising:
a top chip package positioned over the cap and adjacent to the surface of the substrate, and the top chip package electrically coupled to the second subset of bond pads exposed on the surface of the substrate.

16. The chip package of claim 14, wherein the plurality of extensions are composed of encapsulating material and formed integrally with the cap.

17. A chip package, comprising:
a substrate having a plurality of bond pads on a surface;
an integrated circuit adjacent to the surface of the substrate, the integrated circuit electrically coupled to a first subset of the plurality of bond pads; and
a cap on the surface of the substrate encapsulating the integrated circuit and the first subset of the plurality of bond pads, the cap having a plurality of extensions extending on the surface of the substrate to a perimeter of the substrate, and the cap leaving a second subset of the bond pads exposed on the surface of the substrate.

18. The chip package of claim 17, further comprising:
a top chip package positioned over the cap and adjacent to the surface of the substrate, and the top chip package electrically coupled to the second subset of bond pads exposed on the surface of the substrate.

19. The chip package of claim 17, wherein the cap is composed of encapsulating material.

* * * * *